United States Patent
Gu et al.

(10) Patent No.: US 10,304,778 B2
(45) Date of Patent: May 28, 2019

(54) WAFER MARKING METHOD

(71) Applicant: EO TECHNICS CO., LTD., Anyang-si, Gyeonggi-do (KR)

(72) Inventors: Chun Hoe Gu, Anyang-si (KR); Soo Young Kim, Anyang-si (KR); Sung Beom Jung, Anyang-si (KR)

(73) Assignee: EO TECHNICS CO., LTD, Gyeonggi-Do (KR)

( * ) Notice: Subject to any disclaimer, the term of this patent is extended or adjusted under 35 U.S.C. 154(b) by 253 days.

(21) Appl. No.: 15/315,434

(22) PCT Filed: Aug. 11, 2014

(86) PCT No.: PCT/KR2014/007448
§ 371 (c)(1),
(2) Date: Dec. 1, 2016

(87) PCT Pub. No.: WO2016/003005
PCT Pub. Date: Jan. 7, 2016

(65) Prior Publication Data
US 2017/0200680 A1    Jul. 13, 2017

(30) Foreign Application Priority Data
Jul. 3, 2014   (KR) ........................ 10-2014-0083232

(51) Int. Cl.
*H01L 23/544*  (2006.01)
*C03C 23/00*   (2006.01)
(Continued)

(52) U.S. Cl.
CPC ........ *H01L 23/544* (2013.01); *B23K 26/0006* (2013.01); *B23K 26/082* (2015.10);
(Continued)

(58) Field of Classification Search
USPC .... 438/463, 464, 760, 462, 709; 216/94, 97, 216/99, 102, 103, 104, 108; 156/345.1,
(Continued)

(56) References Cited

U.S. PATENT DOCUMENTS 6,257,224 B1   7/2001  Yoshino et al.
6,720,522 B2 *  4/2004  Ikegami ............. B23K 26/0732
                                                219/121.69
(Continued)

FOREIGN PATENT DOCUMENTS

CN   101533771 A    9/2009
CN   101794723 A    8/2010
(Continued)

OTHER PUBLICATIONS

Office Action issued by the Taiwan Intellectual Property dated Mar. 9, 2017 in corresponding Taiwanese Application No. 104117877( pages).
(Continued)

*Primary Examiner* — Lan Vinh
(74) *Attorney, Agent, or Firm* — Buchanan Ingersoll & Rooney PC

(57) ABSTRACT

Disclosed is a wafer marking method using a laser for marking a wafer having processing tape attached thereto. The disclosed laser marking method comprises the steps of: penetrating a 532-nm wavelength laser beam through the processing tape attached to one side of the wafer; and performing marking on the one side of the wafer by moving the 532-nm wavelength laser beam at a predetermined velocity, wherein the 532-nm wavelength laser beam has a frequency of 8 kHz to 40 kHz, and an output power of 0.8 W to 2 W.

6 Claims, 1 Drawing Sheet

(51) Int. Cl.
    H01L 21/268    (2006.01)
    H01L 21/683    (2006.01)
    B23K 26/00     (2014.01)
    B23K 26/18     (2006.01)
    B23K 26/082    (2014.01)
    B23K 26/352    (2014.01)
    H01L 21/67     (2006.01)
    B23K 101/40    (2006.01)
    B23K 103/00    (2006.01)

(52) U.S. Cl.
    CPC ............ *B23K 26/18* (2013.01); *B23K 26/352* (2015.10); *B23K 26/355* (2018.08); *C03C 23/0025* (2013.01); *H01L 21/268* (2013.01); *H01L 21/6836* (2013.01); *B23K 2101/40* (2018.08); *B23K 2103/56* (2018.08); *H01L 21/67282* (2013.01); *H01L 2223/54433* (2013.01); *H01L 2924/0002* (2013.01)

(58) Field of Classification Search
    USPC ..................................... 156/345.19
    See application file for complete search history.

(56) References Cited

U.S. PATENT DOCUMENTS

| | | | |
|---|---|---|---|
| 8,492,907 B2 | 7/2013 | Takamoto et al. | |
| 8,704,382 B2 | 4/2014 | Takamoto et al. | |
| 9,287,175 B2* | 3/2016 | Hua ........................ | H01L 21/78 |
| 2008/0176376 A1* | 7/2008 | Kobayashi ............... | B41M 5/24 |
| | | | 438/401 |
| 2010/0047999 A1* | 2/2010 | Hoshino ........... | H01L 21/67092 |
| | | | 438/463 |
| 2010/0193967 A1 | 8/2010 | Takamoto | |
| 2012/0223335 A1 | 9/2012 | Tsuchiya | |
| 2014/0162434 A1* | 6/2014 | Shiga .................... | H01L 23/544 |
| | | | 438/464 |
| 2014/0361443 A1 | 12/2014 | Shiga et al. | |
| 2015/0037915 A1* | 2/2015 | Lei .......................... | H01L 21/78 |
| | | | 438/16 |

FOREIGN PATENT DOCUMENTS

| | | | |
|---|---|---|---|
| CN | 102153960 | A | 8/2011 |
| CN | 102376616 | A | 3/2012 |
| CN | 102653035 | A | 9/2012 |
| CN | 103165542 | A | 6/2013 |
| JP | 10-305420 | | 11/1998 |
| JP | 2004-502551 | A | 1/2004 |
| JP | 2005-294636 | A | 10/2005 |
| KR | 10-2001-0073299 | A | 8/2001 |
| KR | 10-2008-0036724 | A | 4/2008 |
| KR | 10-2009-0044082 | A | 5/2009 |
| KR | 10-2010-0009335 | A | 1/2010 |
| KR | 10-2010-0088582 | A | 8/2010 |
| KR | 10-2013-0076442 | A | 7/2013 |
| TW | 201340195 | A | 10/2013 |

OTHER PUBLICATIONS

Notification of the First Office Action dated Jun. 28, 2018, by the State Intellectual Property Office of People's Republic of China in corresponding Chinese Patent Application No. 201480079450.2, with an English translation of the Office Action. (14 pages).
International Search Report (PCT/ISA/210) dated Feb. 27, 2015, by the Republic of Korea Patent Office as the International Searching Authority for International Application No. PCT/KR2014/007448.
Written Opinion (PCT/ISA/237) dated Feb. 27, 2015, by the Republic of Korea Patent Office as the International Searching Authority for International Application No. PCT/KR2014/007448.
Republic of Korea Notice of Allowance dated Jan. 27, 2016 for Foreign Priority Application No. KR 10-2014-0083232.

* cited by examiner

WAFER MARKING METHOD

TECHNICAL FIELD

The present invention relate to a method of marking a wafer, and more particularly, to a method of performing a laser marking operation with respect to a surface of a wafer by irradiating a laser beam on the surface of the wafer through a processing tape attached to the surface of the wafer.

BACKGROUND ART

When performing a laser marking operation with respect to a thin wafer or a wafer having a warpage, the wafer is likely to be damaged. Therefore, to avoid damaging the wafer, a method of performing a laser processing operation in a state where a processing tape is attached to a surface of the wafer has been used. In this case, in order to perform the laser marking operation with respect to the wafer to which the processing tape is attached, a laser beam needs to be irradiated through the processing tape to reach the surface of the wafer. In general, the processing tape attached to the wafer may be formed of various materials, and thus, a transmittance of the laser beam through the processing tape may vary depending on the material of the processing tape. The quality of the laser marking operation with respect to the surface of wafer is dependent upon the transmittance of the processing tape.

DETAILED DESCRIPTION OF THE INVENTION

Technical Problem

One or more embodiments of the present invention include a method of performing a laser marking operation with respect to a surface of a wafer by irradiating a laser beam having a wavelength of 532 nm through a processing tape attached to the surface of the wafer.

Advantageous Effects of the Invention

According to embodiments of the present invention, when performing a marking operation with respect to the wafer to which a processing tape is attached, the wafer marking may be performed by irradiating a laser beam having a wavelength of 532 nm through the processing tape attached to a surface of the wafer. In this case, the laser marking quality may be improved by optimizing the frequency, the output power, and the moving velocity of the laser beam according to a transmittance of the processing tape.

BEST MODE

Figure 1:
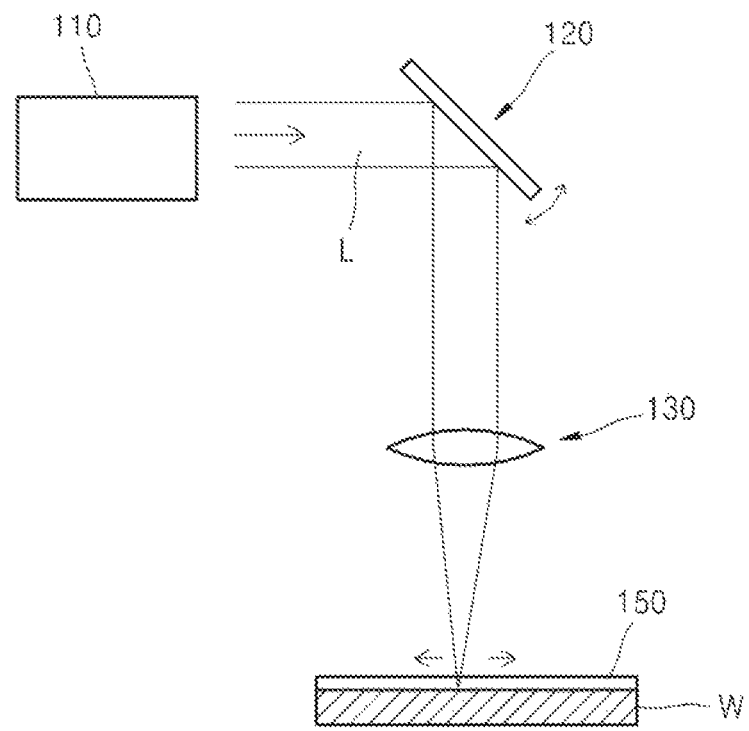
FIG. 1 is a schematic diagram of a laser marking system according to an embodiment of the present invention.

Reference will now be made in detail to embodiments, examples of which are illustrated in the accompanying drawings. The embodiments set forth herein are not intended to limit the scope of the present invention. Rather, these embodiments are provided to explain aspects of the present invention to one of ordinary skill in the art. In the drawings, like reference numerals refer to like elements throughout, and sizes or thicknesses of elements may be exaggerated for clarity of explanation. It will be understood that when a material layer is referred to as being "on" a substrate or another layer, the material layer nay be directly on the substrate or the other layer, or another third layer may be present therebetween. In addition, a material referred to as being used to form each layer is just an example, and another material may also be used.

Figure 2:
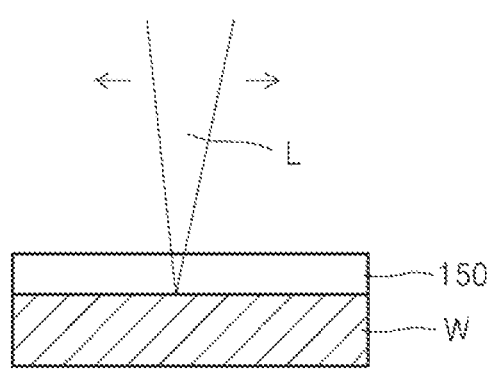
FIG. 2 is an enlarged view of a wafer and a processing tape attached to an upper surface of the wafer shown in FIG. 1.

FIG. 1 is a schematic diagram of a laser marking system according to an embodiment of the present invention, and FIG. 2 is an enlarged view of a wafer W of FIG. 1 and a processing tape 150 attached to a surface of the wafer W.

Referring to FIGS. 1 and 2, the laser marking system according to the present embodiment includes a laser light source 110 emitting a laser beam L, a scanner 120, on which the laser beam L emitted from the laser light source 110 is incident, to perform a marking operation by scanning the incident laser beam L on the surface of the wafer W at a predetermined velocity, and a focusing lens 130 focusing the laser beam L emitted from the scanner 120 on the surface of the wafer W. Although not shown in the drawings, at least one optical unit may be further disposed in an optical path of the laser beam L.

The wafer W that is an object of the marking operation may be a silicon wafer or a sapphire wafer, but is not limited thereto. That is, wafers of various materials may be used as the wafer W. In addition, the processing tape 150 is attached to a surface (upper surface in FIG. 1) of the wafer W. The processing tape 150 may include a material that transmits the laser beam L emitted from the laser light source 110. The processing tape 150 may be formed of, for example, polyvinyl chloride (PVC), polyolefin (PO), or polyethylene (PET). From among PVC, PO, and PET, PVC has the highest transmittance with respect to the laser beam, and PO has the lowest transmittance with respect to the laser beam. However, the present invention is not limited to the above materials, and the processing tape 150 may be formed of other various materials. Also, the processing tape 150 may be transparent, blue, or gray, for example. The processing tape 150 has the highest transmittance with respect to the laser beam L when it is transparent and also has the lowest transmittance with respect to the laser beam L when it is gray. However, the embodiments of the present invention are not limited thereto, and the processing tape 150 may have other various colors.

The laser beam L for performing a marking operation is emitted from the laser light source 110. In the present embodiment, the laser beam L emitted from the laser light source 110 may be a green laser beam having a wavelength of 532 nm. The laser beam L having 532 nm wavelength emitted from the laser light source 110 is incident onto the scanner 120, and the scanner 120 reflects the laser beam L of 532 nm wavelength toward the focusing lens 130. In this case, the scanner 120 may scan the incident laser beam L through a rotation, and accordingly, a moving velocity of the laser beam L that is incident onto the surface of the wafer W may be adjusted according to the rotation of the scanner 120.

The laser beam L having 532 nm wavelength emitted from the scanner 120 passes through the processing tape 150 via the focusing lens 130, and then, is focused onto the surface of the wafer W. Then, the laser beam L incident onto the surface of the wafer W is moved by the scanner 120 at a predetermined velocity so that a marking operation may be performed with respect to the surface of the wafer W.

In the present embodiment, the laser beam L having the wavelength of 532 nm and emitted from the laser light source 110 may have a frequency ranging from about 8 kHz to about 40 kHz, and an output power of about 0.8 W to about 2 W. In this case, a marking quality on the wafer W may be determined by adjusting the frequency, output power, and moving velocity of the laser beam L having the wavelength of 532 nm according to the transmittance of the processing tape. For example, if the transmittance of the processing tape 150 is relatively high, excellent marking quality may be obtained by using the laser beam L of 532 nm wavelength, which has a relatively small output power. In addition, if the transmittance of the processing tape 150 is low, high marking quality may be obtained by only using the laser beam L of 532 nm wavelength, which has a relatively high output power.

In particular, if the transmittance of the processing tape 150 with respect to the laser beam L having the wavelength of 532 nm is relatively high, the laser beam L of the 532 nm wavelength may have a frequency of about 20 kHz to about 40 kHz and an output power of about 0.8 W to about 1.5 W. In this case, if the moving velocity of the laser beam L of the 532 nm wavelength is set to be 300 mm/s or faster, excellent marking quality may be obtained.

Also, if the transmittance of the processing tape 150 with respect to the laser beam L having the wavelength of 532 nm is relatively low, the laser beam L of the 532 nm wavelength may have a frequency of about 8 kHz to about 20 kHz and an output power of about 1 W to about 2 W. In this case, if the moving velocity of the laser beam L having the 532 nm wavelength is set to be within a range from 200 mm/s to 300 mm/s, excellent marking quality may be obtained.

As described above, according to the laser marking method of the present embodiment, excellent marking quality may be obtained by adjusting the frequency, output power, and moving velocity of the laser beam L having the 532 nm wavelength according to the transmittance of the processing tape 150.

While one or more embodiments of the present invention have been described with reference to the figures, they should be considered in a descriptive sense only, and it will be understood by those of ordinary skill in the art that various changes in form and details may be made therein.

MODE OF THE INVENTION

According to one or more embodiments of the present invention, a method of marking a wafer by using laser, a processing tape being attached to the wafer, the method includes: transmitting a laser beam having a wavelength of 532 nm through the processing tape attached to a surface of the wafer; and performing a marking operation on the surface of the wafer by moving the laser beam having the wavelength of 532 nm at a predetermined velocity, wherein the laser beam having the wavelength of 532 nm has a frequency of 8 kHz to 40 kHz and an output power of 0.8 W to 2 W.

A marking quality of the wafer may be determined by adjusting the frequency, the output power, and the moving velocity of the laser beam having the wavelength of 532 nm according to a transmittance of the processing tape.

The laser beam having the wavelength of 532 nm may have a frequency of 20 kHz to 40 kHz and an output power of 0.8 W to 1.5 W, and the moving velocity of the laser beam may be 300 mm/s or greater. The laser beam having the wavelength of 532 nm may have a frequency of 8 kHz to 20 kHz and an output power of 1 W to 2 W, and the moving velocity of the laser beam may be 200 mm/s to 300 mm/s.

The processing tape may include polyvinyl chloride (PVC), polyolefin (PO), or polyethylene (PET). The processing tape may be transparent, blue, or gray.

The invention claimed is:

1. A method of marking a wafer by using laser, a processing tape being attached to the wafer, the method comprising:
   transmitting a laser beam having a wavelength of 532 nm through the processing tape attached to a surface of the wafer; and
   performing a marking operation on the surface of the wafer by moving the laser beam having the wavelength of 532 nm at a predetermined velocity,
   wherein the laser beam having the wavelength of 532 nm has a frequency of 8 kHz to 40 kHz and an output power of 0.8 W to 2 W.

2. The method of claim 1, wherein a marking quality of the wafer is determined by adjusting the frequency, the output power, and the moving velocity of the laser beam having the wavelength of 532 nm according to a transmittance of the processing tape.

3. The method of claim 2, wherein the laser beam having the wavelength of 532 nm has a frequency of 20 kHz to 40 kHz and an output power of 0.8 W to 1.5 W, and the moving velocity of the laser beam is 300 mm/s or greater.

4. The method of claim 2, wherein the laser beam having the wavelength of 532 nm has a frequency of 8 kHz to 20 kHz and an output power of 1 W to 2 W, and the moving velocity of the laser beam is 200 mm/s to 300 mm/s.

5. The method of claim 1, wherein the processing tape comprises polyvinyl chloride (PVC), polyolefin (PO), or polyethylene (PET).

6. The method of claim 1, wherein the processing tape is transparent, blue, or gray.

* * * * *